United States Patent
Park et al.

(10) Patent No.: US 8,436,370 B2
(45) Date of Patent: May 7, 2013

(54) OPTICAL MODULATOR WITH PIXELIZATION PATTERNS

(75) Inventors: Yong-hwa Park, Yongin-si (KR); Yong-chul Cho, Suwon-si (KR); Soo-haeng Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 398 days.

(21) Appl. No.: 12/644,564

(22) Filed: Dec. 22, 2009

(65) Prior Publication Data

US 2010/0163889 A1    Jul. 1, 2010

(30) Foreign Application Priority Data

Dec. 31, 2008    (KR) .................. 10-2008-0138715

(51) Int. Cl.
*H01L 31/14*    (2006.01)
(52) U.S. Cl.
USPC .................................... 257/84; 257/E31.097
(58) Field of Classification Search .................. 257/84, 257/E31.097
See application file for complete search history.

(56) References Cited

U.S. PATENT DOCUMENTS

| | | | |
|---|---|---|---|
| 5,451,767 A * | 9/1995 | Amano et al. | 250/214.1 |
| 5,504,365 A | 4/1996 | Yamazaki et al. | |
| 5,698,858 A | 12/1997 | Borner | |
| 6,331,911 B1 | 12/2001 | Manassen et al. | |
| 6,483,094 B1 | 11/2002 | Yahav et al. | |
| 6,794,628 B2 | 9/2004 | Yahav et al. | |
| 7,067,853 B1 | 6/2006 | Yao | |
| 7,079,307 B2 | 7/2006 | Liu et al. | |
| 7,196,390 B1 | 3/2007 | Manassen et al. | |
| 7,842,957 B2 * | 11/2010 | Goh et al. | 257/82 |

FOREIGN PATENT DOCUMENTS

| | | |
|---|---|---|
| JP | 2002-277766 A | 9/2002 |
| JP | 2004-70273 A | 3/2004 |
| JP | 2007-17953 A | 1/2007 |
| KR | 10-2006-0094666 A | 8/2006 |

* cited by examiner

*Primary Examiner* — Calvin Lee
*Assistant Examiner* — Monica D Harrison
(74) *Attorney, Agent, or Firm* — Sughrue Mion, PLLC

(57) ABSTRACT

Provided is an optical modulator having pixelization patterns. The optical modulator includes an optical-electric (O-E) conversion element converting input optical images to current signals using the photoelectric effect, and an electric-optical (E-O) conversion element that emits light using the current signals transferred from the O-E conversion element. Trenches are formed from at least a surface of the optical modulator to a predetermined depth in the optical modulator so as to block or reduce electrical interference between pixels when the electric signals are transferred from the O-E conversion element to the E-O conversion element.

20 Claims, 19 Drawing Sheets

OPTICAL MODULATOR WITH PIXELIZATION PATTERNS

CROSS-REFERENCE TO RELATED APPLICATIONS

This application claims the benefit of Korean Patent Application No. 10-2008-0138715, filed on Dec. 31, 2008, in the Korean Intellectual Property Office, the disclosure of which is incorporated herein in its entirety by reference.

BACKGROUND

1. Field

One or more exemplary embodiments relate to an optical modulator, and more particularly, to an optical modulator having pixelization patterns so as to obtain image modulation with high resolution.

2. Description of the Related Art

An optical-electric-optical (O-E-O) modulator, which receives optical information (images) to convert the optical information into electrical information, modulates the electrical information, and outputs the optical information (images), may have functions of converting wavelengths, amplifying light and performing modulation at a high speed, and thus, has been used as a core component in three-dimensional (3D) cameras, laser radars (LADARs), and infrared (IR) imaging.

The O-E-O modulator operates by a mechanism of receiving images having wavelengths of about 800 nm to 1700 nm, that is, an infrared ray (IR) band, generating electric currents using the photoelectric effect, amplifying or modulating the electric currents to a desired waveform such as a sine waveform, a ramp waveform, or a square waveform, supplying the electric currents to a light emitting device such as a light-emitting diode (LED) to output images having wavelengths of about 450 nm to 650 nm, that is, a visible ray band which has a high sensitivity with respect to an imaging device such as a charge-coupled device (CCD), in proportion to the received images.

An image intensifier, which uses a multi-channel plate (MCP) in an electron amplification, is a representative device that adopts the O-E-O modulator. However, the MCP is fabricated by forming holes, which have a diameter of a few μm, in a glass by as many as the number of pixels, and the MCP includes a vacuum package for the electron amplification. Therefore, fabrication costs are increased and the volume of the MCP is too large.

Therefore, semiconductor-based O-E-O modulators, which are small and massly produced, have been developed recently, and the semiconductor-based O-E-O modulators have been mainly realized on a GaAs substrate.

SUMMARY

One or more exemplary embodiments include a semiconductor-based optical modulator having pixelization patterns, which may obtain image modulations of high resolution by preventing a degradation of resolution that may generate when an optical-electric-optical (O-E-O) optical modulator is realized on a semiconductor substrate.

Additional aspects will be set forth in part in the description which follows and, in part, will be apparent from the description, or may be learned by practice of the presented exemplary embodiments.

To achieve the above and/or other aspects, one or more exemplary embodiments may include an optical modulator including: an optical-electric (O-E) conversion element converting input optical images to current signals using the photoelectric effect; an electric-optical (E-O) conversion element that emits light using the current signals transferred from the O-E conversion element; and a trench formed from at least a surface of the optical modulator to a predetermined depth in the optical modulator so as to block or reduce electric interferences between pixels when the electric signals are transferred from the O-E conversion element to the E-O conversion element.

The trench may be formed from the O-E conversion element to a predetermined depth in the optical modulator toward the E-O conversion element. The trench may be formed from the E-O conversion element to a predetermined depth in the optical modulator toward the O-E conversion element. The trench may be formed from the O-E conversion element to a predetermined depth of the optical modulator toward the E-O conversion element and formed from the E-O conversion element to a predetermined depth of the optical modulator toward the O-E conversion element so as to be formed on both sides of the optical modulator.

The trench may be formed to completely penetrate the optical modulator from the O-E conversion element to the E-O conversion element.

The trench may be formed to have a tapered shape or a stepped shape so that a cross-sectional width of the trench may be changed according to the depth in the optical modulator.

A plurality of trenches may form a discrete trench pattern, in which the trenches are discrete around pixels so that one pixel is electrically connected to adjacent pixels at four points, a cross-shaped trench pattern, in which one pixel is electrically connected to adjacent pixels at two points and four adjacent pixels are connected to each other at one connection point, and a branch-shaped trench pattern, in which one pixel is electrically connected to adjacent pixels at two points and one connection point is located at center portions of circumferences defining the pixels or at corners of the circumference.

The optical modulator may further include a transferring element transferring the current signals from the O-E conversion element to the E-O conversion element between the O-E conversion element and the E-O conversion element.

The transferring element may include a semiconductor substrate.

The trench may be formed from a surface of the optical modulator to a predetermined depth of the transferring element.

A first transparent electrode may be formed on an optical image incident surface of the optical modulator, a second transparent electrode may be formed on an optical image output surface of the optical modulator, and an internal electrode may be formed between the O-E conversion element and the E-O conversion element.

According to the optical modulator of one or more exemplary embodiments of the present invention, a resolution degradation caused by electric interference between the pixels of the optical modulator may be prevented to improve image resolution, and at the same time, a loss of rigidity in the optical modulator may be reduced and ease of electric wiring may be maintained.

According to an exemplary embodiment, there is an optical modulator including: an optical-electric (O-E) conversion element that converts an optical image into signals through a photoelectric effect; an electric-optical (E-O) conversion element that emits light using the signals from the O-E conversion element; and a trench having a predetermined depth from at least a surface of the optical modulator to block or reduce electric interferences between pixels when the signals are transferred from the O-E conversion element to the E-O conversion element.

BRIEF DESCRIPTION OF THE DRAWINGS

These and/or other aspects will become apparent and more readily appreciated from the following description of the exemplary embodiments, taken in conjunction with the accompanying drawings of which.

DETAILED DESCRIPTION

Figure 1:
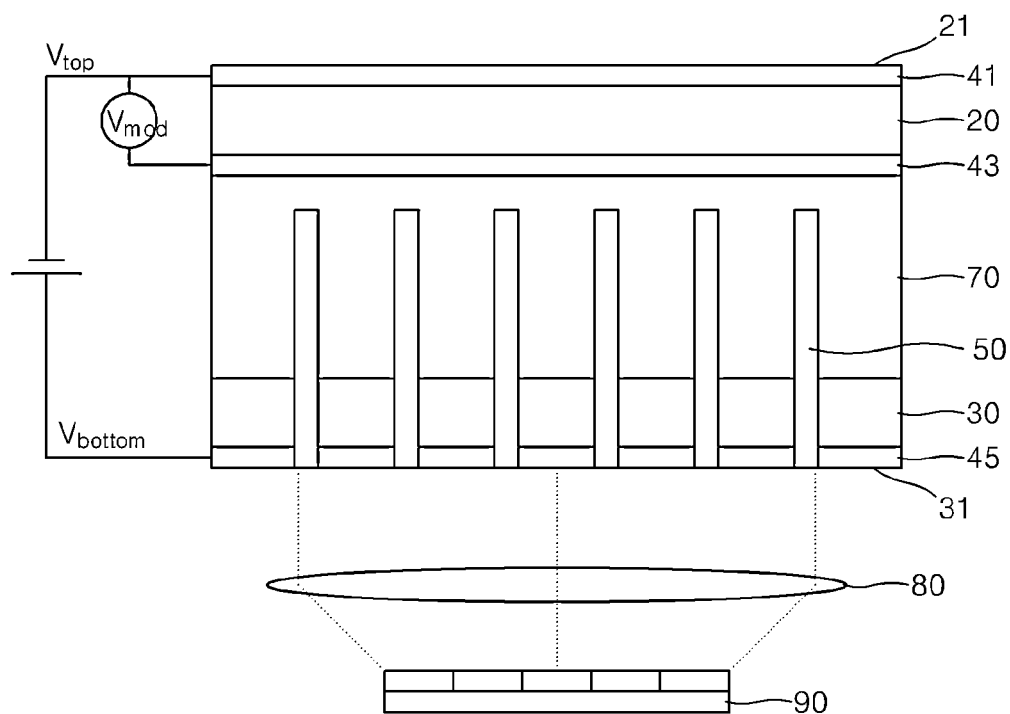
FIG. 1 is a diagram of a semiconductor-based optical modulator according to an exemplary embodiment.

Reference will now be made in detail to exemplary embodiments, examples of which are illustrated in the accompanying drawings, wherein like reference numerals refer to the like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

FIG. 1 schematically shows a semiconductor-based optical modulator according to an exemplary embodiment.

Referring to FIG. 1, the semiconductor-based optical modulator is a device which modulates an incident infrared ray (IR) image and transmits the modulated image, and includes an optical-electric (O-E) conversion element 20 that converts an input optical image into electric current using the photoelectric effect, an electric-optical (E-O) conversion element 30 that emits light using the electric current transferred from the O-E conversion element 20, and patterned trenches 50 formed to block or reduce electrical interference between pixels. A first transparent electrode 41 may be disposed on an optical image incident surface 21 of the semiconductor-based optical modulator, a second transparent electrode 45 may be disposed on an optical image output surface 31 of the semiconductor-based optical modulator, and an internal electrode 43 may be disposed between the O-E conversion element 20 and the E-O conversion element 30. The semiconductor-based optical modulator may further include an electric-electric (E-E) transferring element 70 between the O-E conversion element 20 and the E-O conversion element 30 so as to transfer electric signals of the O-E conversion element 20 to the E-O conversion element 30.

The O-E conversion element 20 converts the input optical image into the electric current using the photoelectric effect, and at the same time, may amplify or modulate the electric current to a desired function having a sine waveform, a ramp waveform, or a square waveform. The O-E conversion element 20 is a light receiving device for absorbing light, for example, may be formed by stack using the combination of, for example, p-type, n-type, or an intrinsic III-V compound semiconductor (a compound including Al, Ga, In, As, P, or N) and Si or Ge.

The E-O conversion element 30 is a device that emits light using the transferred electric current, and may be formed by coupling a fluorescent material to a light emitting device formed of a p-type, an n-type, or an intrinsic III-V compound semiconductor (a compound including Al, Ga, In, As, P, or N).

The device for transferring an electric current signal (hereinafter, referred to as a transferring element) may be formed by stack using the combination of a p-type, an n-type, or an intrinsic III-V compound semiconductor (a compound including Al, Ga, In, As, P, or N) and Si or Ge. In addition, the E-E transferring element 70 may be a semiconductor substrate such as a GaAs substrate.

For example, a photodiode and a light-emitting diode may be formed on both surfaces of a single GaAs substrate in a semiconductor process to fabricate the semiconductor-based optical modulator according to the present exemplary embodiment. In this case, the photodiode may be used as the O-E conversion element 20, the GaAs substrate may be used as the transferring element 70, and the light-emitting diode may be used as the E-O conversion element 30. As another example, a transferring element 70 may be formed by stack of semiconductor layers, and in this case, the E-O conversion element 30, the transferring element 70, and the O-E conversion element 20 may be formed on a transparent substrate using semiconductor processes.

In the present exemplary embodiment illustrated in FIG. 1 and other exemplary embodiments, the E-E transferring element 70 is disposed between the O-E conversion element 20 and the E-O conversion element 30, however, one or more exemplary embodiments are not limited thereto. That is, the semiconductor-based optical modulator according to one or more exemplary embodiments may have a structure without including the E-E transferring element 70.

The input optical image passes through the first transparent electrode 41 on the upper surface of the O-E conversion element 20 and reaches the O-E conversion element 20. A voltage corresponding to a modulated signal of $V_{mod}$ is applied to the O-E conversion element 20, and thus, electron-hole pairs are generated in the O-E conversion element 20 in proportion to the applied voltage and the input optical image. The modulation signal of $V_{mod}$ may be applied through the first transparent electrode 41 and the internal electrode 43. Generated electrons have an electron image, which is in proportion to the input optical image. The electron image is moved toward the E-O conversion element 30 due to an electric field generated by bias voltages, $V_{top}$ and $V_{bottom}$, applied to the first transparent electrode 41 on the upper surface of the O-E conversion element 20 and the second transparent electrode 45 under the lower surface of the E-O conversion element 30. The electron image passes through the E-E transferring element 70 formed of, for example, the semiconductor substrate such as a GaAs substrate, and reaches the E-O conversion element 30 to generate light.

Therefore, the optical image, which is in proportion to the input optical image incident on the upper surface of the semiconductor-based optical modulator, is output from a lower surface of the semiconductor-based optical modulator. A magnification of the output optical image is appropriately adjusted while the output optical image passes through a relay lens set, and then, the output optical image is focused on an image sensor such as a charge-coupled device (CCD) or a complementary metal-oxide semiconductor (CMOS) to be captured.

On the other hand, in the semiconductor-based optical modulator according to the present exemplary embodiment, the trench 50 is formed to block or reduce electrical interference between pixels. The semiconductor-based optical modulator according to one or more exemplary embodiments may have an optical modulation performance with a high resolution by using transparent patterned electrodes formed on upper and lower surfaces of the semiconductor-based optical modulator in addition to the trenches 50.

When the electron image passes through the semiconductor substrate, that is, the E-E transferring element 70, the electron image may be diffused in a direction transverse to the desired transferring direction which is a vertical direction. The diffusion of the electron image in the transverse direction may arise because the concentration of the electrons is not uniform in the transverse direction due to the difference between the brightness of pixels. Therefore, when the image incident to the upper surface of the semiconductor-based optical modulator is transferred as the output image to the lower surface of the semiconductor-based optical modulator, the image may be blurred. The blurring of the image may degrade the resolution of the image being transmitted, and accordingly, the resolution of the entire image system may be degraded.

Thus, the trenches 50 remove or reduce the electrical interference between the pixels to reduce the image blur phenomenon by being a barrier to block the undesired transverse diffusion of the electron image.

Figure 2:
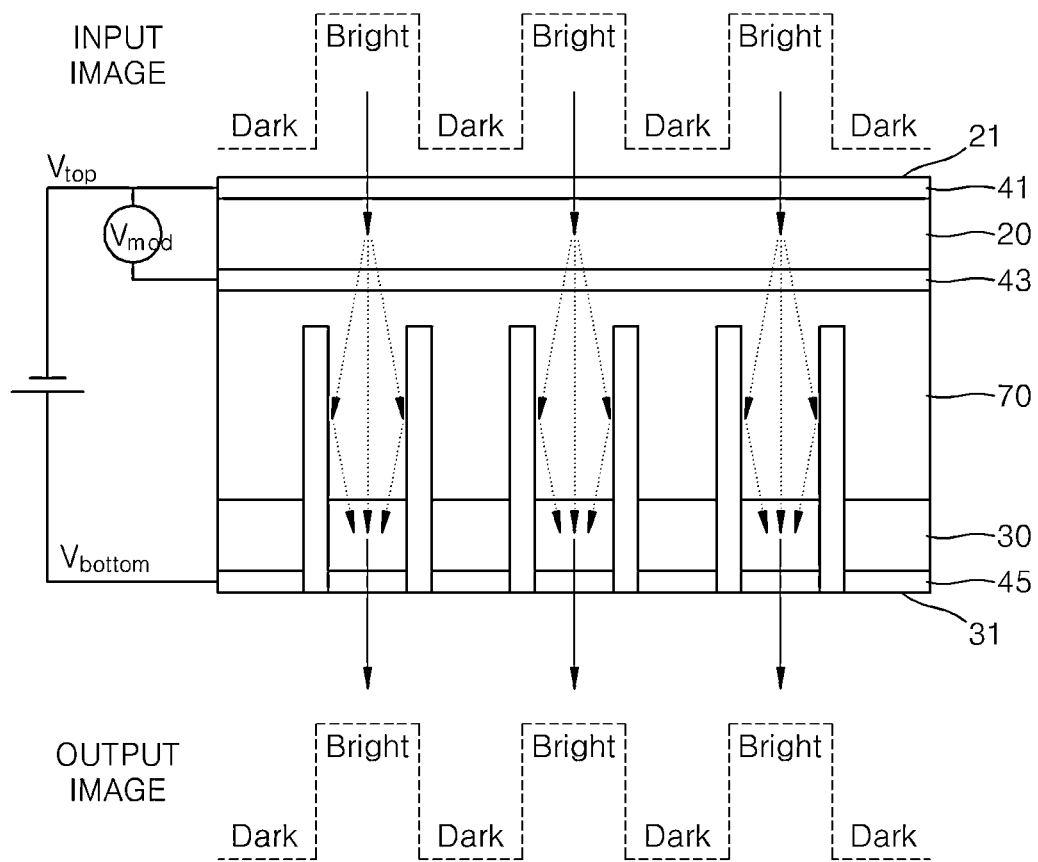
FIG. 2 shows a transferring process of electrons and output images when an image pattern, in which dark pixels and bright pixels are sequentially arranged, is input to the semiconductor-based optical modulator having a trench pattern illustrated in FIG. 1.
Figure 3:
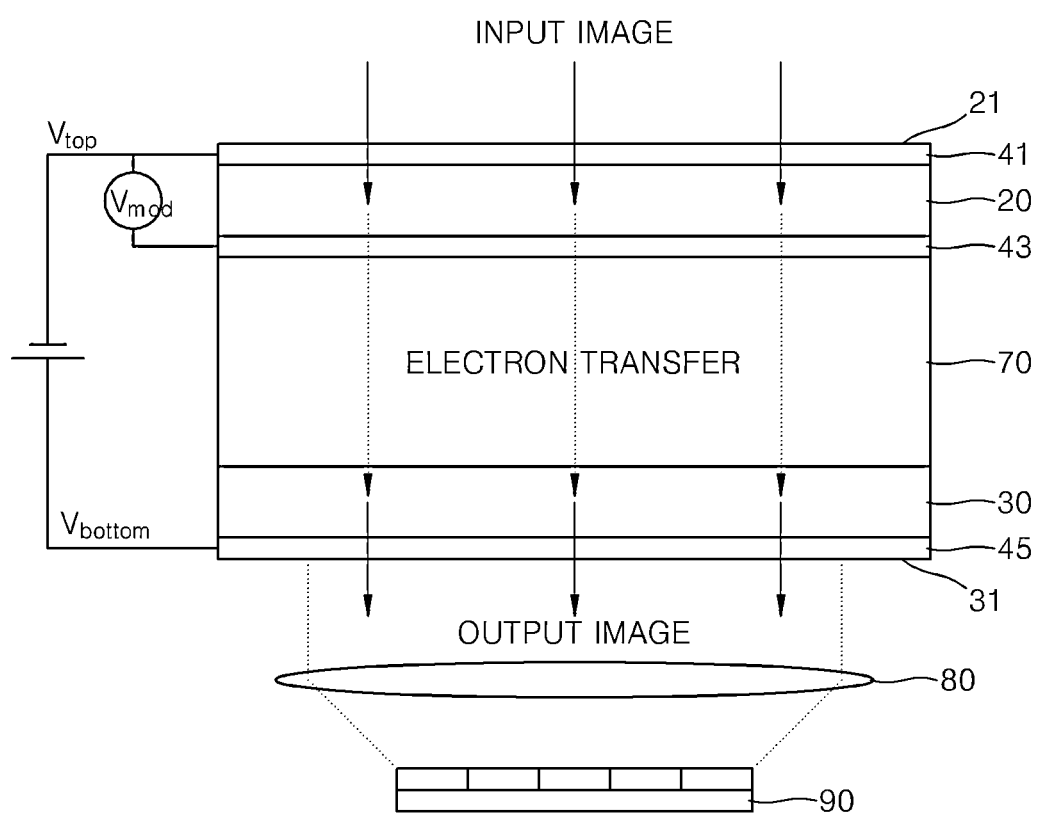
FIG. 3 is a diagram showing an optical modulator having no trench pattern as a comparative example.

FIG. 2 shows a process of transferring electrons and an output image when an image pattern, in which dark pixels and bright pixels are sequentially arranged, is incident on the semiconductor-based optical modulator having the patterned trenches 50 (not shown in FIG. 2) illustrated in FIG. 1. FIG. 3 shows an optical modulator which does not have patterned trenches as a comparative example, and FIG. 4 shows a process of transferring electrons and an output image when an image pattern, in which dark pixels and bright pixels are sequentially arranged, is incident on the optical modulator without the trench, as illustrated in FIG. 3.

Figure 4:
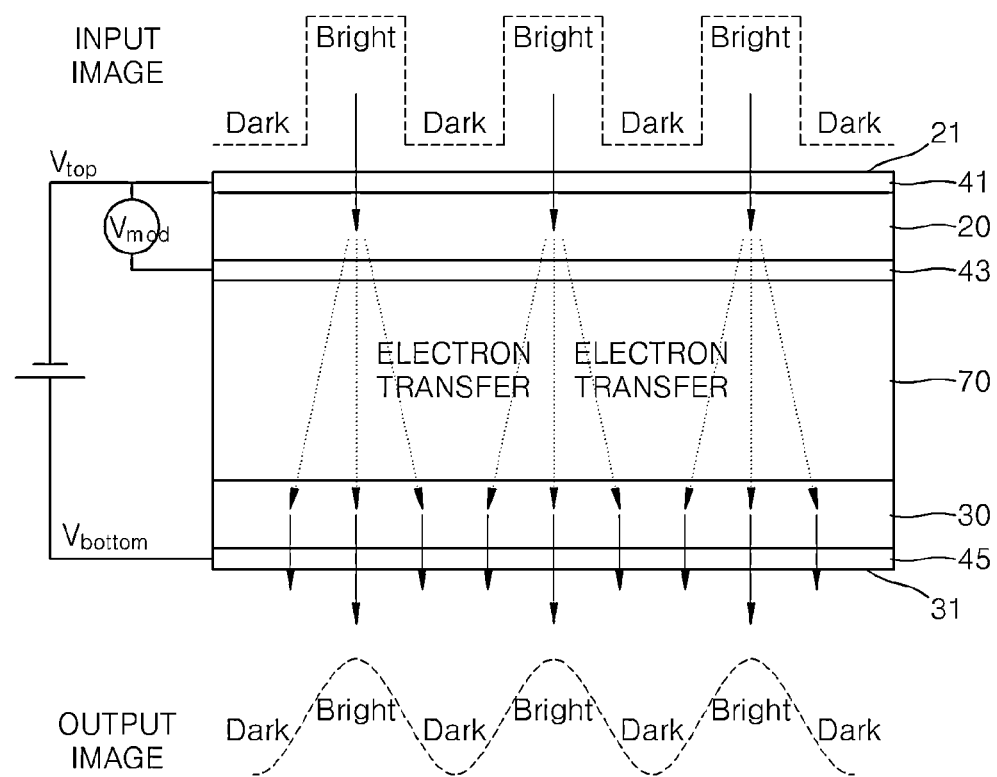
FIG. 4 shows a transferring process of electrons and output images when an image pattern, in which dark pixels and bright pixels are sequentially arranged, is input to the optical modulator illustrated in FIG. 3.

Referring to FIGS. 3 and 4, when the image pattern, in which the dark and bright pixels are arranged sequentially, is incident on the optical modulator which does not include the trench, the electron transfer in the vertical direction caused by the electric field generated due to bias voltages $V_{top}$ and $V_{bottom}$ may be accompanied by the electron diffusion in the transverse direction because the concentration of electrons generated by the brightness difference between the pixels is uneven in the transverse direction.

The electron diffusion in the transverse direction may degrade a contrast between pixels in the output image, and accordingly, the image blur phenomenon occurs when the image incident on the upper surface of the optical modulator is transferred as the output image to the lower surface of the optical modulator. When the image blur generated due to crosstalk of the electrons between the pixels is severe so as not to distinguish a pixel from adjacent pixels, the resolution of passing image may be degraded, and thus the resolution of the entire image system may be degraded.

On the other hand, referring to FIG. 2, when the image pattern, in which the dark and bright pixels are sequentially arranged, is incident on the semiconductor-based optical modulator which includes the trenches 50 that may block or reduce the electron diffusion in the transverse direction, the electron diffusion in the transverse direction which is caused by the uneven concentration of the electrons due to the brightness difference of the images between pixels in the transverse direction may be physically blocked, and the electrons may be transferred from pixel to pixel in the vertical direction. Therefore, the output image expresses the image pattern, in which the dark and bright pixels are sequentially arranged, like the input image. The resolution of the image in the semiconductor-based optical modulator may be determined by the number of pixels on the lower surface, which is defined by the trenches 50, of the semiconductor-based optical modulator.

Referring to FIG. 1, the trenches 50 may be formed by using a semiconductor etching process such as a deep reactive-ion etching (DRIE). The ratio between the depth and the width of a trench (slenderness ratio) may be set to be 20:1 or greater.

The trenches 50 illustrated in FIG. 1 may be formed by etching sequentially the second transparent electrode 45 from the lower surface of the semiconductor-based optical modulator, the E-O conversion element 30, and the E-E transferring element 70. After forming the trenches 50, gas or an electric insulator such as $SiO_2$ may be filled in the trenches 50.

As described above, when the image pattern, in which the dark and bright pixels are sequentially arranged, is input to the semiconductor-based optical modulator having the trenches 50, the diffusion of generated electrons in the transverse direction is physically blocked by the trenches 50 which are electric insulators, and thus, the electrons are transferred in the vertical direction from pixel to pixel. Consequently, the output image expresses the image pattern, in which the dark and bright pixels are sequentially arranged, like the input image. At this time, the resolution of the semiconductor-based optical modulator is determined by the number of pixels on the lower surface, which are defined by the trenches 50, of the semiconductor-based optical modulator.

Hereinafter, various modifications of the semiconductor-based optical modulator according to one or more exemplary embodiments will be described in view of forming the trenches.

In the semiconductor-based optical modulator according to one or more exemplary embodiments, the trenches 50 may be formed to a predetermined depth, from the E-O conversion element 30 into the E-E transferring element 70, that is, the semiconductor substrate, as shown in FIG. 1. That is, the trenches 50 may be formed through the second transparent electrode 45, the E-O conversion element 30, and in the E-E transferring element 70, to a predetermined depth. Hereinafter, depth may be in a vertical downward direction or may be a vertical upward direction. When it is assumed that the light incident surface, that is, the optical image incident surface 21, is an upper portion of the semiconductor-based optical modulator and the light output surface, that is, the optical image output surface 31, is the lower portion of the semiconductor-based optical modulator, the semiconductor-based optical modulator illustrated in FIG. 1 has lower trenches.

Figure 5:
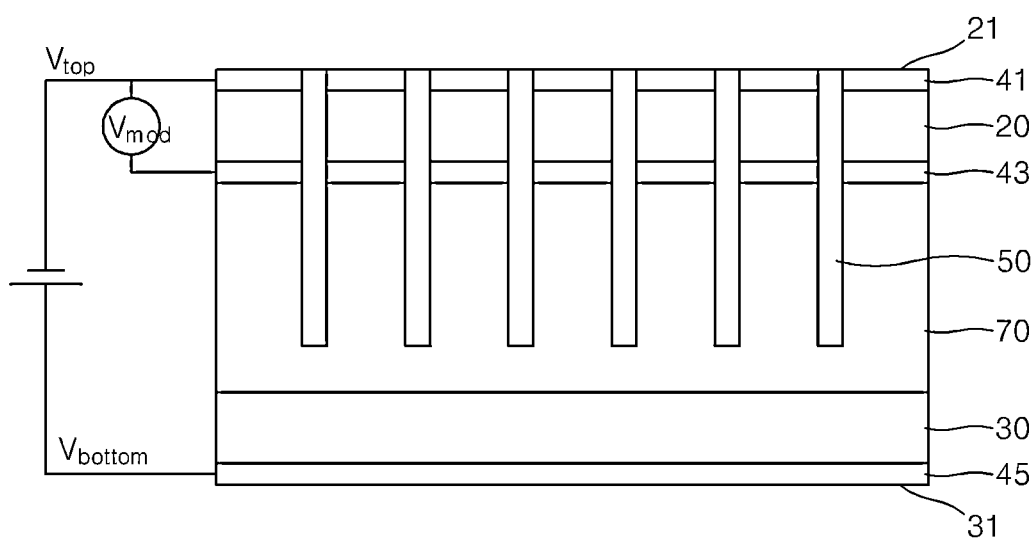
FIGS. 5 through 8 are schematic diagrams illustrating semiconductor-based optical modulators according to other exemplary embodiments.

The trenches 50 may be formed to a predetermined depth from the O-E conversion element 20 into the E-E transferring element 70, that is, the semiconductor substrate, as illustrated in FIG. 5. That is, the trenches 50 may be formed to a predetermined depth through the first transparent electrode 41, and the O-E conversion element 20, and into the E-E transferring element 70. When the light incident surface is the upper portion of the semiconductor-based optical modulator and the light output surface is the lower portion of the semiconductor-based optical modulator, the optical semiconductor-based modulator of FIG. 5 has upper trenches.

Figure 6:
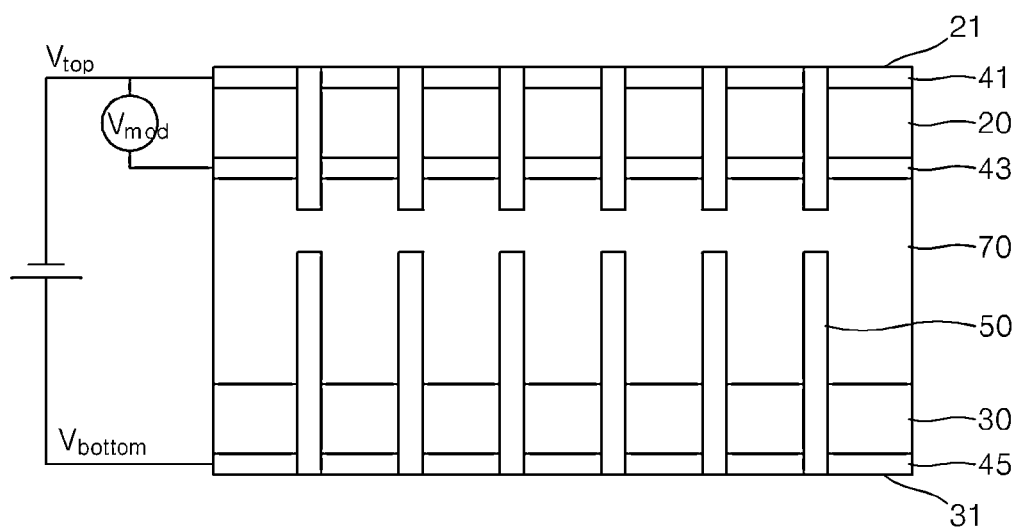

As shown in FIG. 6, in the semiconductor-based modulator according to another exemplary embodiment, trenches 50 may be respectively formed to a predetermined depth, from the O-E conversion element 20 into the E-E transferring element 70, for example, the semiconductor substrate, and may be formed to a predetermined depth, from the E-O conversion element 30 into the E-E transferring element 70, for example, the semiconductor substrate, and accordingly, the trenches 50 are formed on both sides of the semiconductor-based optical modulator, respectively. That is, trenches 50 may be first trenches which are formed to a predetermined depth, through the first transparent electrode 41, and the O-E conversion element 20, and into the E-E transferring element 70, and second trenches which are formed to a predetermined depth, through the second transparent electrode 45, and the E-O conversion element 30, and into the E-E transferring element 70. When the light incident surface is the upper portion of the semiconductor-based optical modulator and the light output surface is the lower portion of the semiconductor-based optical modulator, the semiconductor-based optical modulator illustrated in FIG. 6 has the upper and lower trenches 50.

Figure 7:
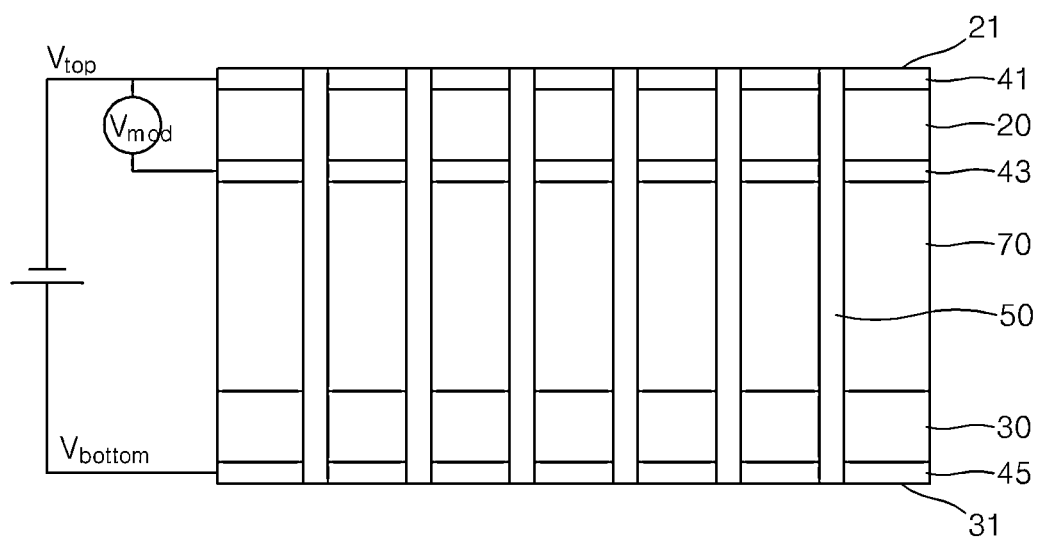

The trenches 50 may be formed to completely penetrate through the semiconductor-based optical modulator, according to another exemplary embodiment, as shown in FIG. 7. When the trenches 50 are formed to completely penetrate the semiconductor-based optical modulator, the semiconductor-based optical modulator is formed to have a structural stability, as will be described later.

On the other hand, in FIGS. 1, and 5 through 7, cross-section of the trenches 50 have a constant width, however, cross-section of the trenches 50 may be formed to have width that varies depending on location in the depth direction of the semiconductor-based optical modulator.

Figure 8:
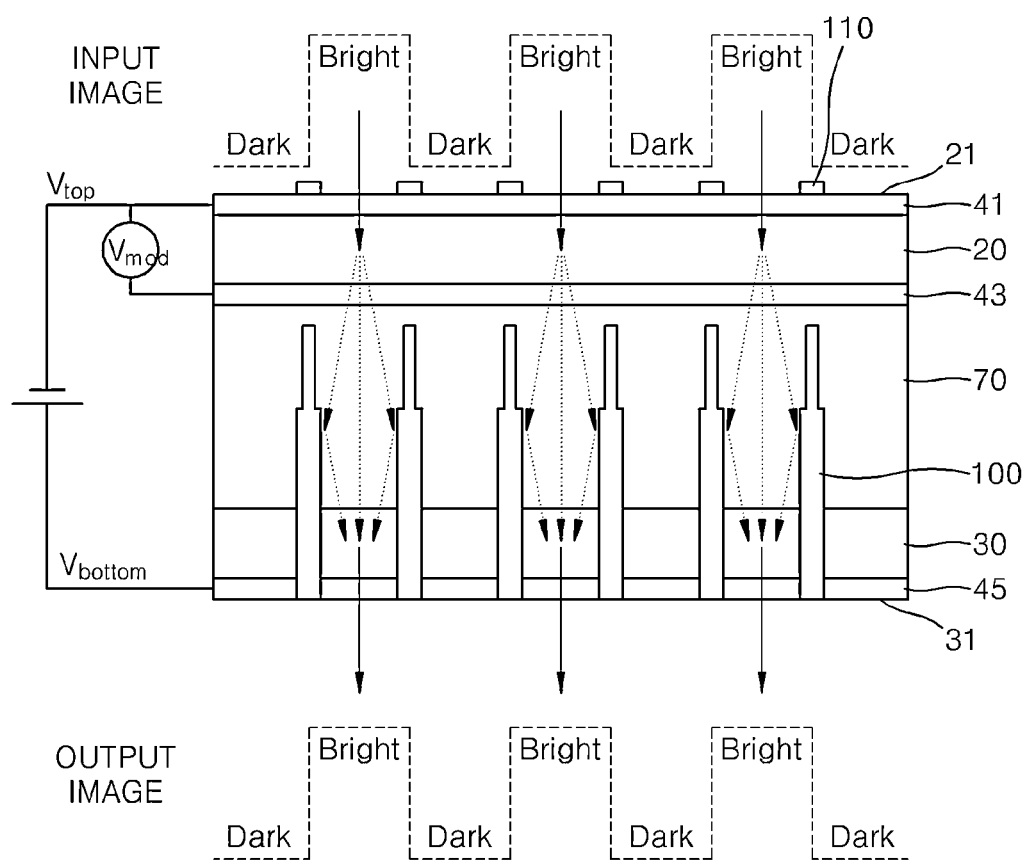

FIG. 8 shows an optical modulator according to another exemplary embodiment, and a cross-section of the trenches 100 are narrow in a deep position of the optical modulator and is wide in a shallow position adjacent to outside, that is, a light incident surface or a light output surface, of the optical modulator. In FIG. 8, the width of the trenches 100 is changed in a stepped shape. As described above, when the trenches 100 are formed to have a wide width at a shallow position of the optical modulator and a narrow width at a deep position in the optical modulator, the etching may be performed to the deeper position than that of the trenches 50 having a constant width. On the other hand, instead of forming the trenches 100 in a stepped shape, the cross-sectional width of the trenches 100 may be continuously changed so that the trenches 100 have a tapered shape, that is, the trenches 100 may have a large cross-sectional width at a shallow portion of the optical modulator and a small cross-sectional width at a deep portion of the optical modulator, or vice versa. Here, the trenches 100 having the cross-sectional width that varies may be applied to the semiconductor-based optical modulators illustrated in FIG. 1, and FIGS. 5 through 7.

On the other hand, as shown in FIG. 8, optical insulators, that is, optical lids 110, may be formed on the optical image incident surface of the optical modulator in order to perform the optical pixelization and thus improve the resolution of the optical modulator. When the optical lids 110 which perform the optical pixelization on the optical image incident surface are formed, the electric image which is incident to the pixels defined by trenches 100 corresponds to the pixels in a one-to-one correspondence, and accordingly, the electrical interference between the pixels may be minimized. The optical lids 110 may be applied to the semiconductor-based optical modulators illustrated in FIG. 1, and FIGS. 5 through 7.

When the trenches 50 or 100 are formed, the conditions that are to be satisfied are that the optical modulator is structurally strong enough not to be damaged during processing and use, and that the optical modulator has an electrode structure which may sufficiently apply voltages to the first transparent electrode 41 or the second transparent electrode 45 that is etched with the trenches 50 or 100, in addition to the basic performance of the trenches 50 or 100 of preventing the electron diffusion in the transverse direction in the E-E transferring element 70, that is, the semiconductor substrate.

Hereinafter, various trench patterns that satisfy the conditions will be described.

Figure 9:
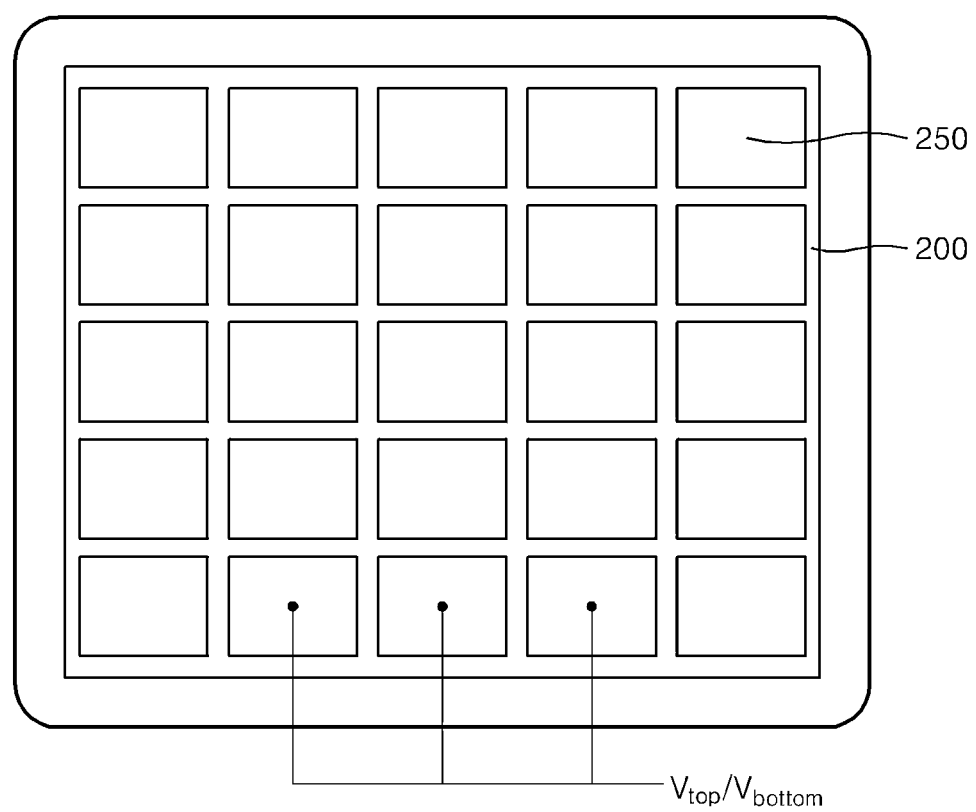
FIG. 9 is a plan view illustrating the simplest type of trench pattern including 5-by-5 pixels.

FIG. 9 is a plan view illustrating a trench pattern 200 of a lattice shape, and 5-by-5 pixels as an example. When the trench pattern 200 is formed in the simple lattice shape illustrated in FIG. 9, the pixels are completely separated from each other by the trench pattern 200 in structure, and accordingly, the optical modulator has a weak structure when the optical modulator is bent due to an external force. In addition, every electrode 250 of the pixels are individually electrically connected.

FIGS. 10 through 13 are plan views illustrating various trench patterns 200 which may ensure structural stability and have an improved wiring in the electrodes 250 of the pixels.

Figure 10:
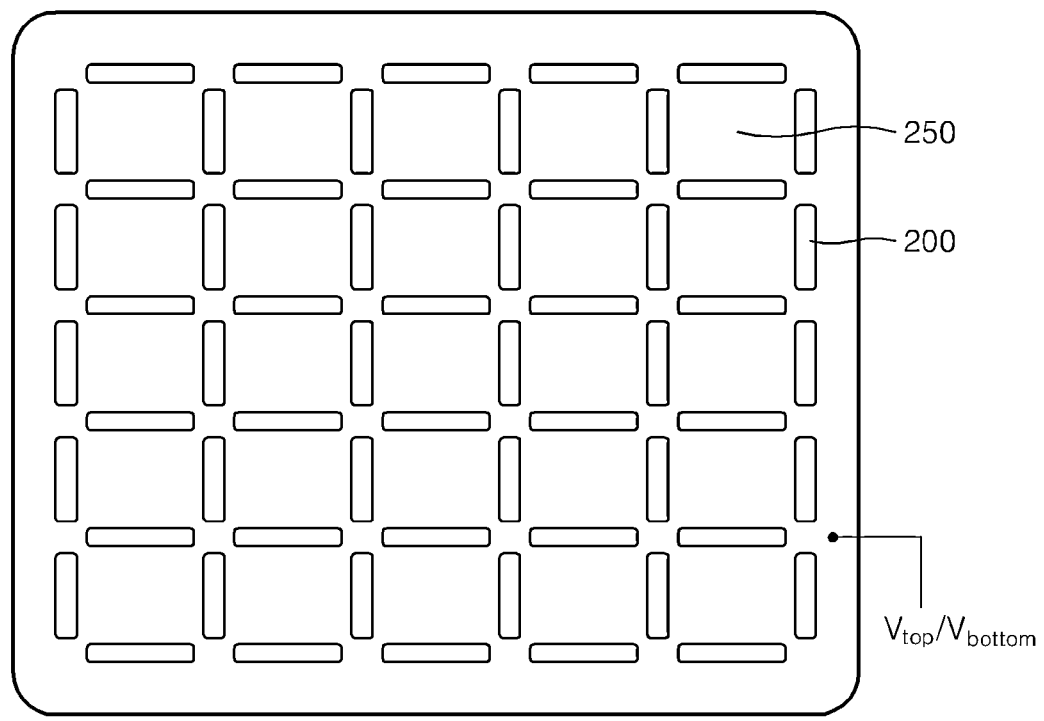
FIGS. 10 through 13 illustrate various examples of trench patterns that may ensure structural stability and improve electrode wiring problems in the pixels.

Referring to FIG. 10, the trench pattern 200 may be formed such as the trenches which define the pixels are discretely formed around the pixels to prevent crosstalk between the pixels due to the electron diffusion. In addition, the pixels are structurally connected to each other, and thus, the strength of the semiconductor substrate may be maintained after etching the semiconductor substrate for forming the trenches. When the trenches penetrate completely through the optical modulator as shown in FIG. 8, the pixels may be structurally connected as shown in FIG. 10. When the trench pattern 200 is formed, transparent electrode 250 is also etched. At this time, when a single electrode or a few separated electrode groups which are electrically connected to each other are formed between the pixels, the bias voltage may be easily applied to the entire pixels through one or a small number of interconnections.

Figure 11:
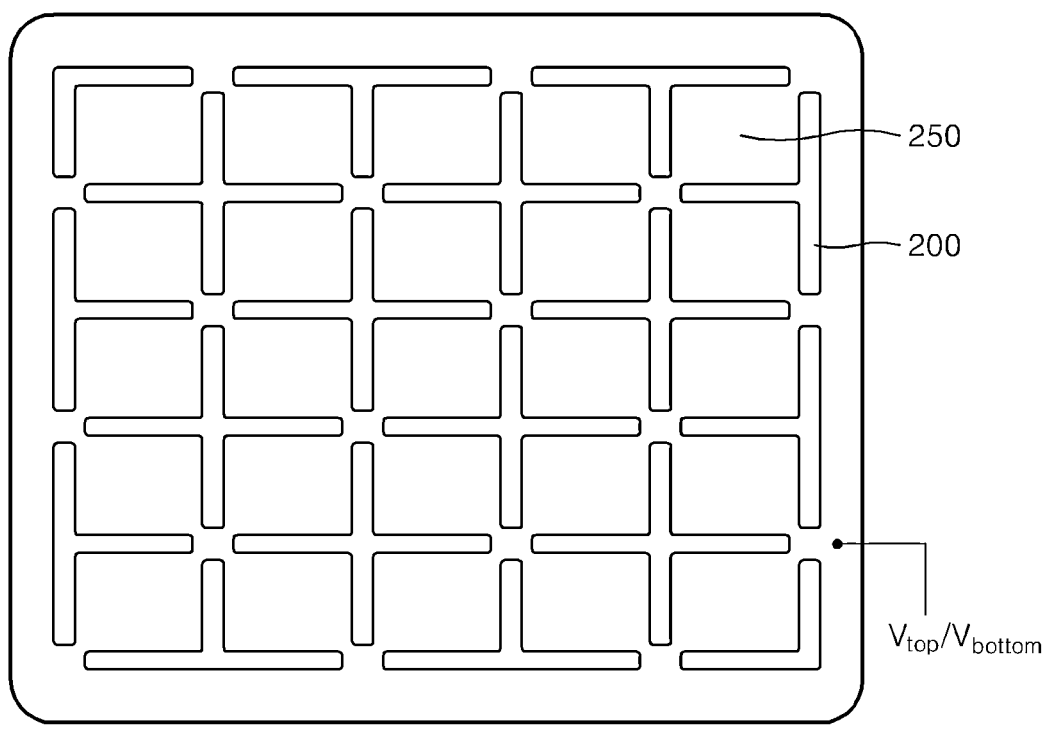
Figure 12:
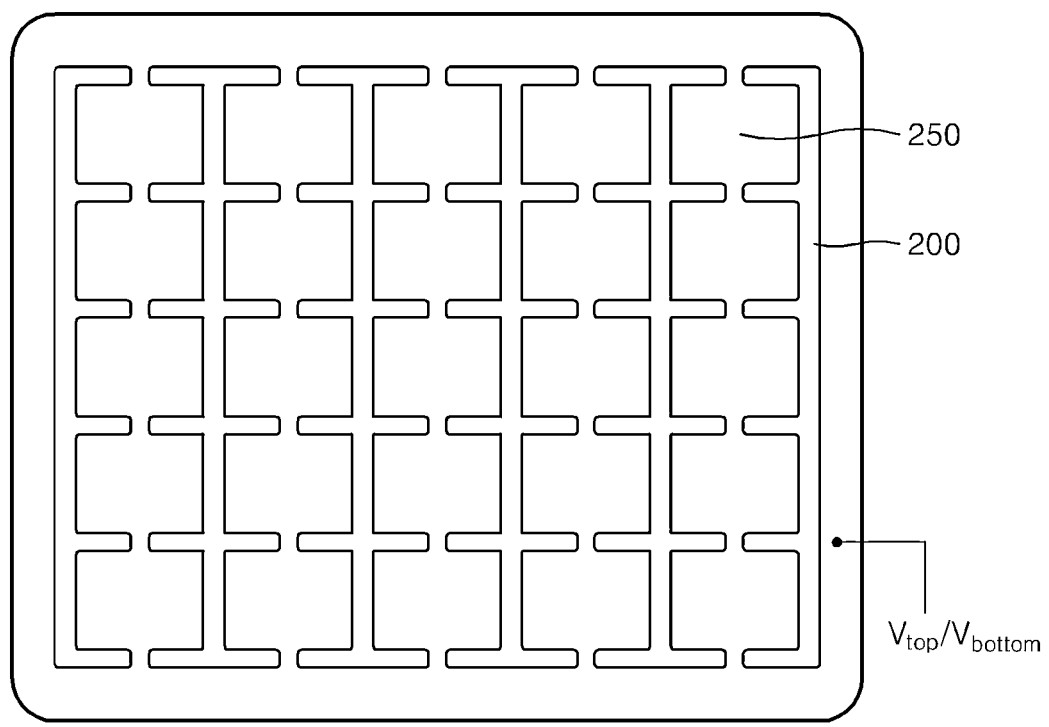
Figure 13:
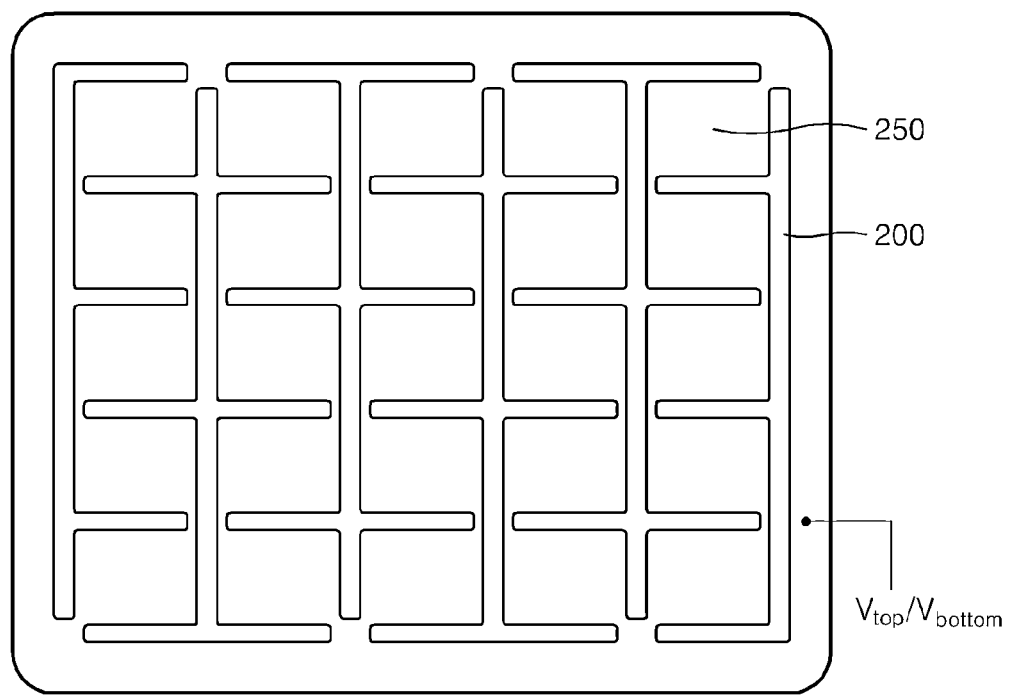

On the other hand, in order to prevent the crosstalk generated by the electron diffusion between the pixels, the connections between the pixels are minimized. To do this, the trench patterns 200 may be modified as shown in FIGS. 11 through 13 in order to reduce the connections between the pixels to be less than those in the trench pattern illustrated in FIG. 10.

That is, the trench pattern 200 illustrated in FIG. 10 is discrete type, one pixel is connected to adjacent pixels at four points, and four adjacent pixels are connected to each other at one connection point. FIG. 11 shows a trench pattern 200 having cross-shape type, in which one pixel is connected to adjacent pixels at two points, and four adjacent pixels are connected to each other at one connection point. FIG. 12 shows a trench pattern 200 having branch-shaped type, in which one pixel is connected to adjacent pixels at two points, and one connection point is located at a center portion between two adjacent pixels. FIG. 13 shows a trench pattern 200 having tranch-shaped type, in which one pixel is connected to adjacent pixels at two points and one connection point is located at corners of two adjacent pixels.

The various trench patterns 200 illustrated in FIGS. 9 through 13 may be applied as a patterned trenches 50 or 100 of an optical modulator according to one or more exemplary embodiments.

Figure 14A:
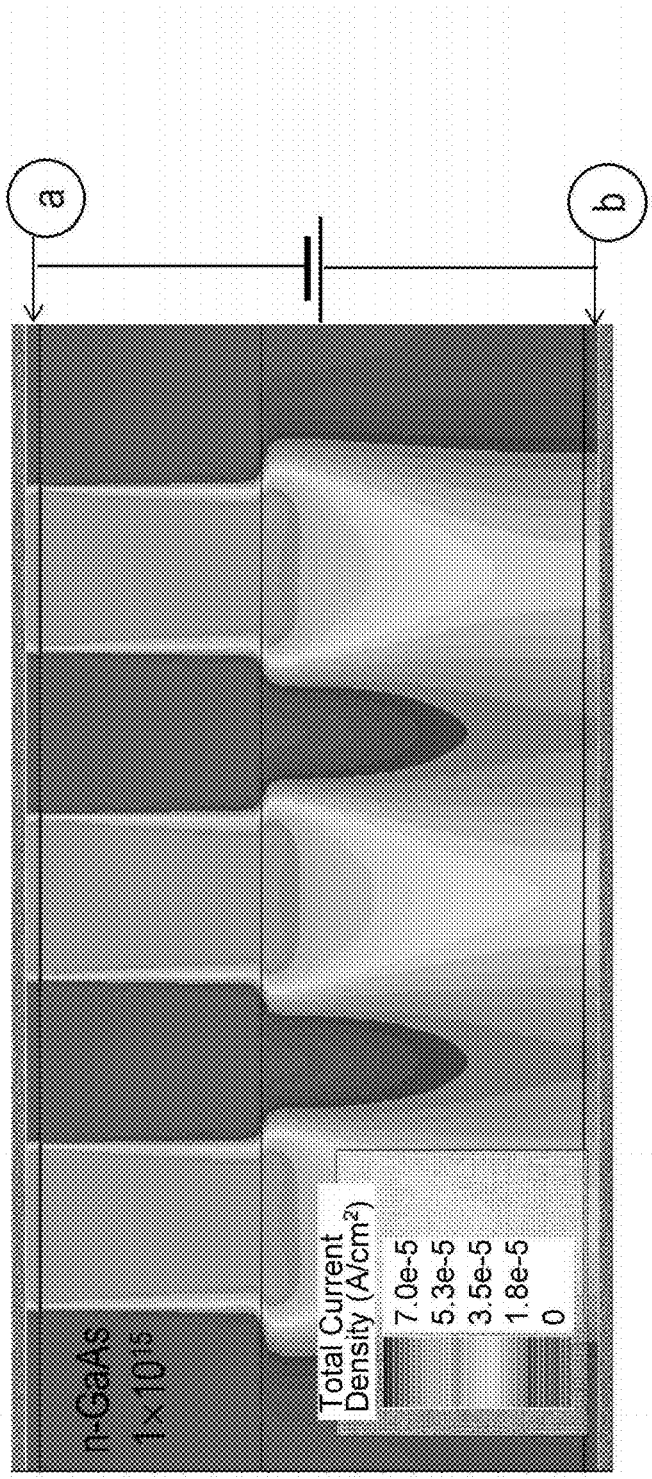
FIGS. 14A and 14B show simulating results of transferring electrons in a GaAs substrate in an optical modulator which does not include a trench pattern.
Figure 14B:
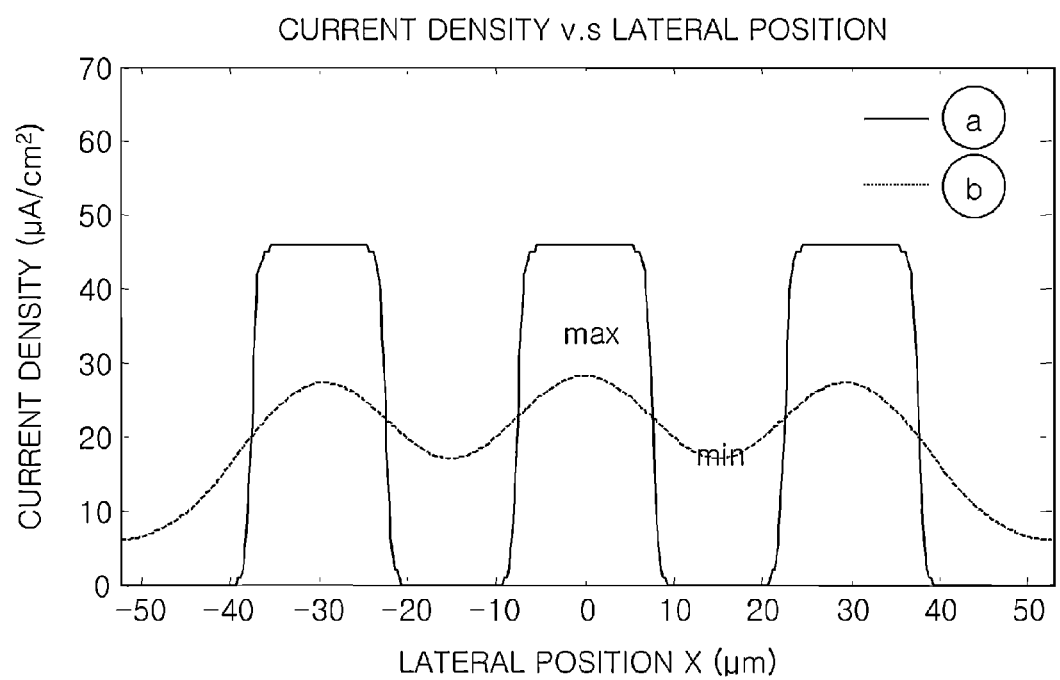

FIGS. 14A and 14B, and FIGS. 15A and 15B show simulation results for identifying affects of the trench pattern to the improvement of resolution of an optical modulator. FIGS. 14A and 14B show results of simulating electron transferring in a GaAs substrate of the optical modulator that does not include the trench pattern. The GaAs substrate is n-doped to transfer electrons. The input optical image, in which the bright and dark pixels are sequentially arranged, is applied to the optical image incident surface 21 on the upper portion of the optical modulator and the voltages are applied to the first and second transparent electrodes 41 and 45 respectively installed on upper and lower surfaces of the optical modulator to generate the electric field, and then, the flow of an electron image is observed. A contrast ratio between the pixels in the input optical image which is applied to the optical image incident surface 21 is max/min=∞, which is an ideal value, and a factor which defines the resolution, that is, MTF=(max−min)/(max+min), is 1, which is a maximum value. When the trench pattern is not formed, the electrons are diffused in the transverse direction as illustrated in FIG. 14A. Therefore, the contrast ratio between the pixels in the output image is degraded as shown in FIG. 14B. The contrast ratio between pixels is max/min=1.511, and the MTF is about 0.202, and accordingly, the resolution is degraded severely.

Figure 15A:
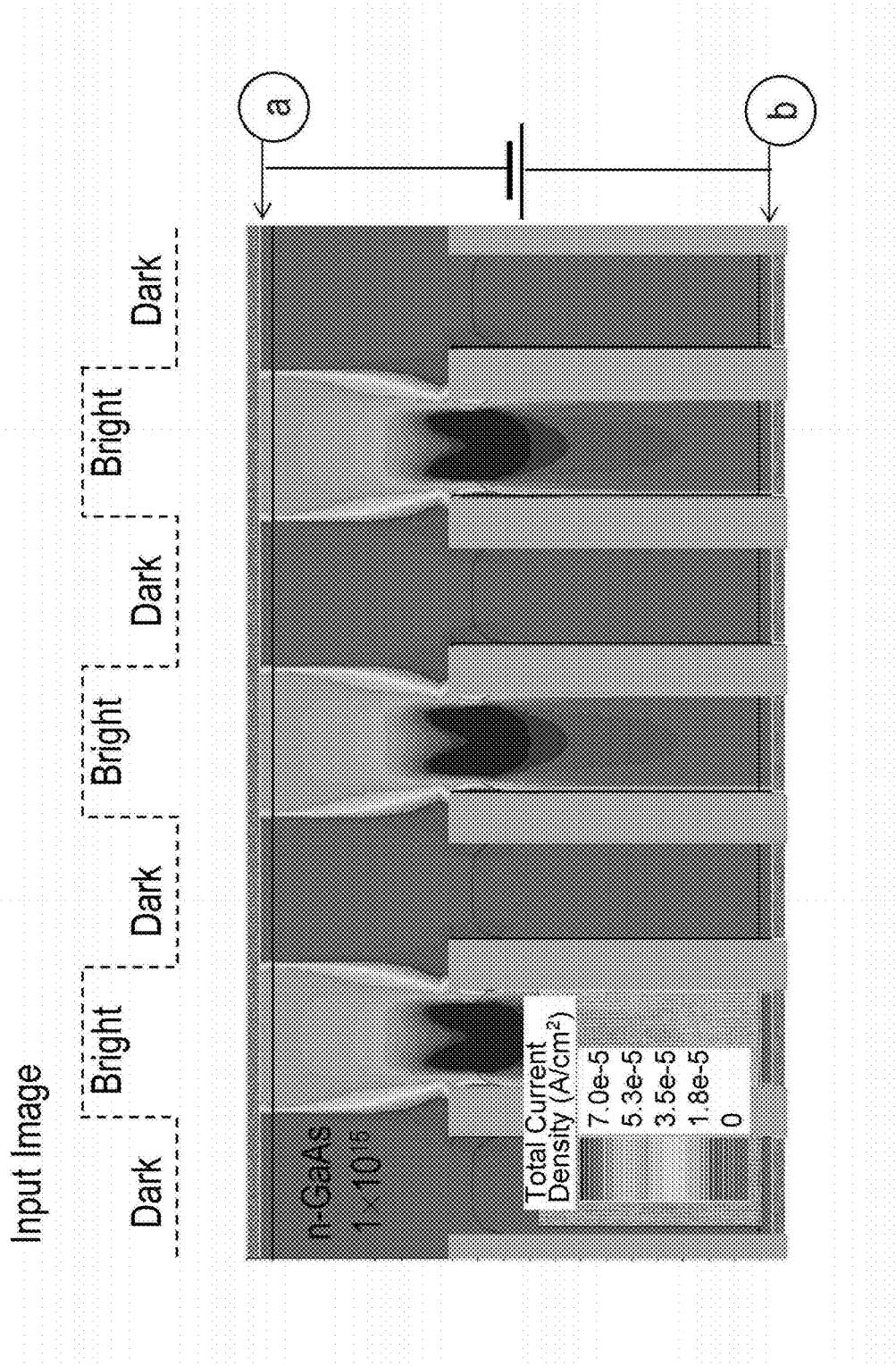
FIGS. 15A and 15B show a flow of electrons when the trench pattern is located in a transferring element, for example, a lower end portion of the semiconductor substrate.
Figure 15B:
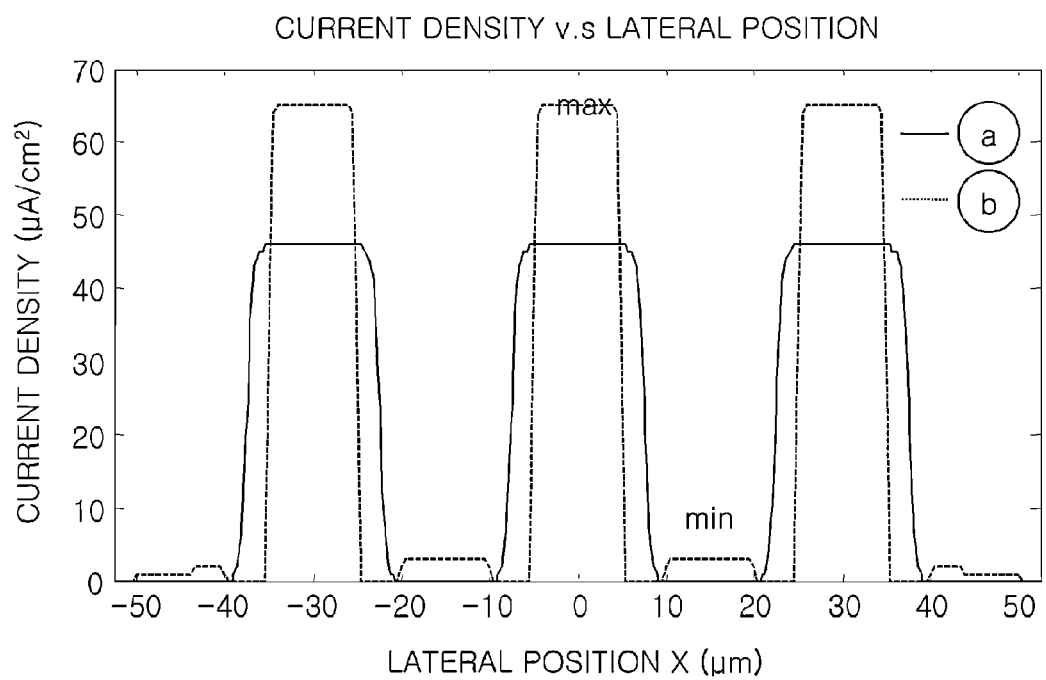

FIGS. 15A and 15B show results of simulating the flow of electrons when the trench pattern is formed on the lower portion of the semiconductor substrate. When the input image which is the same as the input image in FIG. 14 is applied to the optical modulator, the diffusion of electrons in the transverse direction is prevented by the trenches, and the generated electrons are concentrated on bright pixels of the lower portion of the semiconductor substrate as shown in FIG. 15A. Accordingly, the contrast ratio between pixels in the output image is enhanced as shown in FIG. 15B. The contrast ratio between pixels is max/min=22.727, and MTF is about 0.915.

Figure 16A:
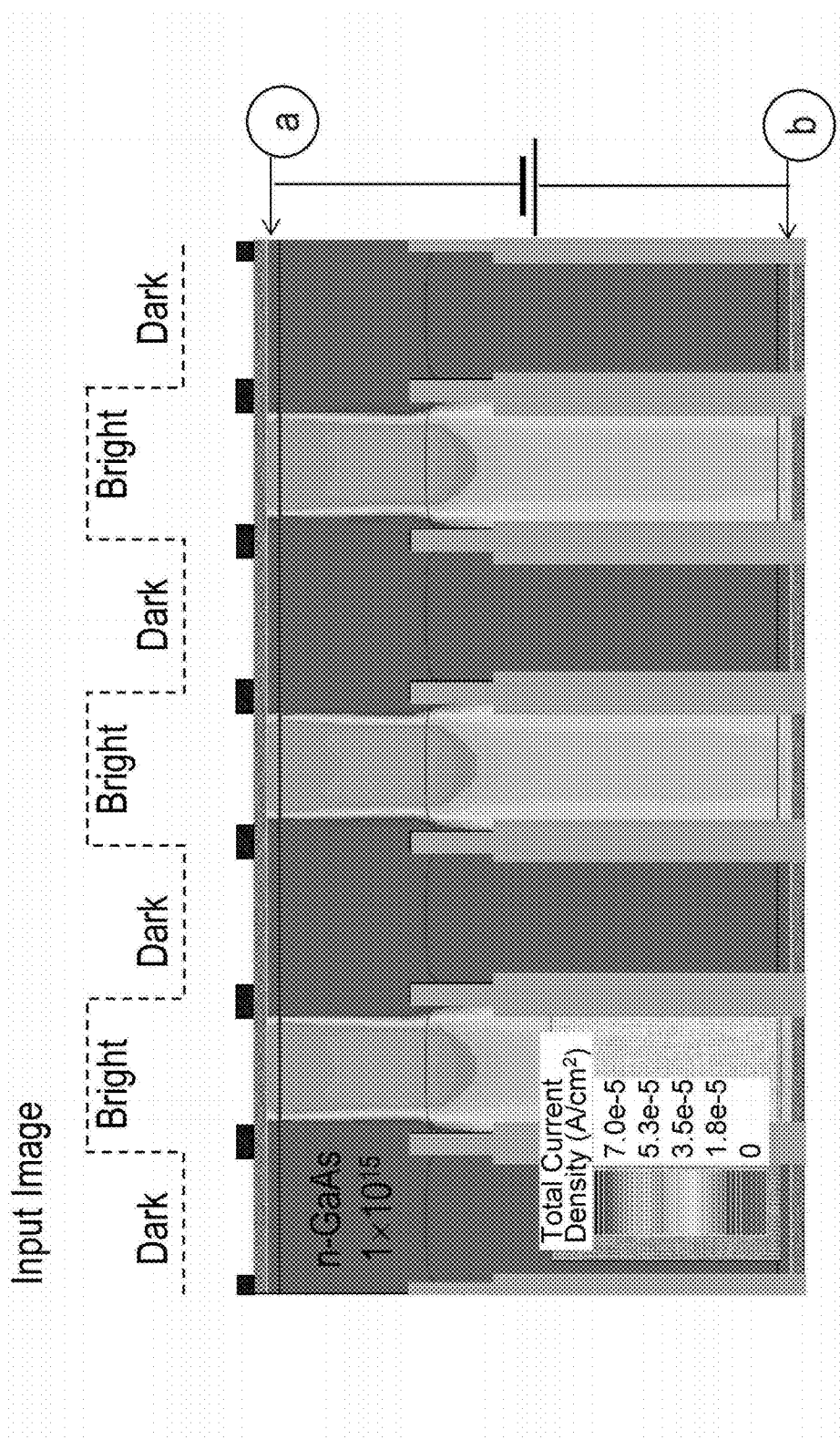
FIGS. 16A and 16B show a flow of electrons when the step type trench pattern illustrated in FIG. 8 is located on the lower end portion of the transferring element, for example, the semiconductor substrate, and an optical lead is located on an upper portion of an imaging surface.
Figure 16B:
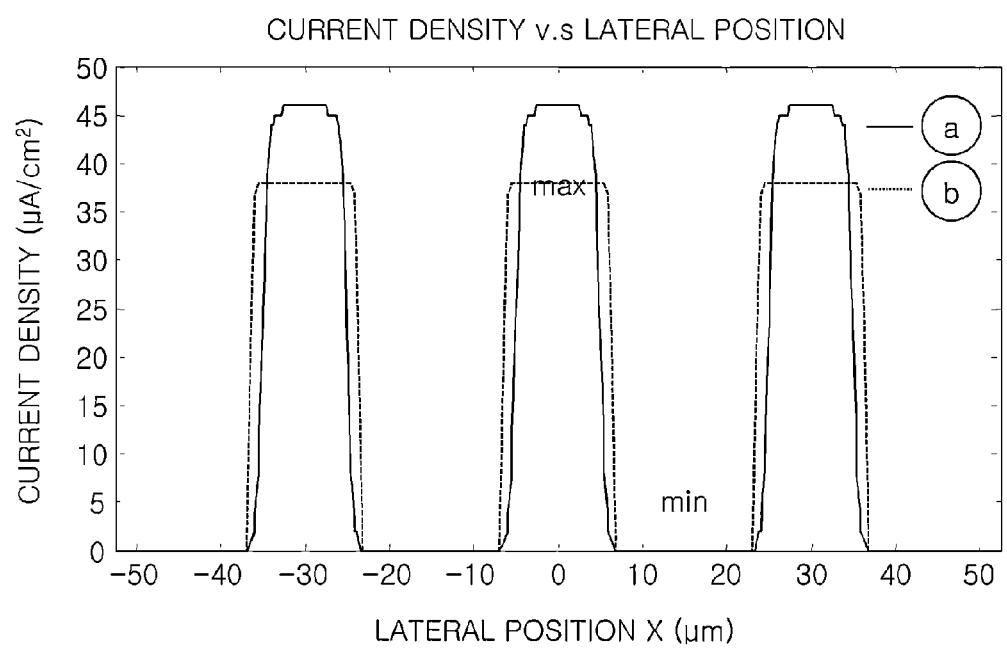

FIGS. 16A and 16B show a flow of electrons in the optical modulator in which the trench pattern having step-shaped trenches shown in FIG. 8 is formed on the lower portion of the semiconductor substrate and optical lids are formed on the optical image incident surface. The input image, which is the same as the input image of FIGS. 14A and 15A, is applied to the optical modulator. As shown in FIG. 16A, the diffusion of electrons in the transverse direction is prevented by the trenches, and the electrical interference between the pixels is prevented more efficiently than the optical modulator of FIG. 15. Accordingly, generated electrons may be concentrated on the bright pixels on the lower portion of the optical modulator. In addition, as shown in FIG. 16B, the contrast ratio between pixels may be improved, and the contrast ratio between the pixels is max/min=12500, and MTF is about 0.999, which means the resolution of the optical modulator may be maximized.

The modified branch-shaped trench pattern illustrated in FIG. 13 shows the highest performance in preventing the crosstalk between the pixels, and the performances in preventing the crosstalk are excellent in an order of the branch-shaped trench pattern illustrated in FIG. 12, the cross-shaped trench pattern illustrated in FIG. 11, and the discrete trench pattern illustrated in FIG. 10. On the other hand, the structural strength of the discrete trench pattern illustrated in FIG. 10 is the highest in a reverse order of above. Therefore, the optical modulator according to one or more exemplary embodiments may be fabricated by applying an optical trench pattern or a combination of various types of trench patterns under consideration of the design characteristics thereof.

As described above, when the trench pattern 50 or trenches 100 are formed, the crosstalk of the electronic signals between the adjacent pixels may be removed or reduced, and accordingly, the output image of the optical modulator may have the desired resolution by pixelization.

Since the trench pattern may be designed in various manners, the degradation of the resolution caused by the electrical interference between the pixels may be resolved, and at the same time, loss of the rigidity of the optical modulator is minimized and the easiness in the electric wiring may be maintained.

In a case of the trench pattern for pixelization, since the pixels are completely separated from each other, the structural strength of the optical modulator becomes weak, and each of the pixels is to be electrically connected to other pixels in post-processes. However, as shown in FIGS. 10 through 13, the trench pattern is formed so that the pixels are connected to adjacent pixels on at least two points in the optical modulator according to one or more exemplary embodiments, and accordingly, the decrease of the structural strength may be prevented, and the electric wiring for connecting the pixels may be simplified.

In addition, when the optical modulator according to one or more exemplary embodiments is applied to devices such as three-dimensional (3D) cameras, laser radars (LADARs), or infrared ray (IR) imaging devices, the resolution may be improved as much as the number of pixels.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

What is claimed is:

1. An optical modulator comprising:
an optical-electric (O-E) conversion element that converts an optical image into signals through a photoelectric effect;
an electric-optical (E-O) conversion element that emits light using the signals from the O-E conversion element;
a trench having a predetermined depth from at least a surface of the optical modulator to block or reduce electric interferences between pixels when the signals are transferred from the O-E conversion element to the E-O conversion element; and
a transferring element which transfers the current signals from the O-E conversion element to the E-O conversion element, and is disposed between the O-E conversion element and the E-O conversion element,
wherein a first transparent electrode is formed on an optical image incident surface of the optical modulator, a second transparent electrode is formed on an optical image output surface of the optical modulator, and an internal electrode is formed between the O-E conversion element and the E-O conversion element.

2. The optical modulator of claim 1, wherein the trench is formed to the predetermined depth from the O-E conversion element into the optical modulator toward the E-O conversion element.

3. The optical modulator of claim 1, wherein the trench is formed to the predetermined depth from the E-O conversion element into the optical modulator toward the O-E conversion element.

4. The optical modulator of claim 1, wherein the predetermined depth is a first predetermined depth and the trench is formed to the first predetermined depth from the O-E conversion element into the optical modulator toward the E-O conversion element and formed to a second predetermined depth from the E-O conversion element into the optical modulator toward the O-E conversion element so as to be formed on both sides of the optical modulator.

5. The optical modulator of claim 1, wherein the trench completely penetrates the optical modulator from the O-E conversion element to the E-O conversion element.

6. The optical modulator of claim 1, wherein the trench comprises a tapered shape or a stepped shape so that a cross-sectional width of the trench varies according to a depth in the optical modulator.

7. The optical modulator of claim 1, wherein the trench is of a plurality of trenches and the plurality of trenches is of one of a discrete trench pattern, in which the plurality of trenches are discretely disposed around pixels so that one pixel is electrically connected to adjacent pixels at four points, a cross-shaped trench pattern, in which one pixel is electrically connected to adjacent pixels at two points and four adjacent pixels are connected to each other at one connection point, and a branch-shaped trench pattern, in which one pixel is electrically connected to adjacent pixels at two points and one connection point is located at center portions of circumferences defining the pixels or at corners of the circumference.

8. An optical modulator comprising:
an optical-electric (O-E) conversion element that converts an optical image into signals through a photoelectric effect;
an electric-optical (E-O) conversion element that emits light using the signals from the O-E conversion element; and
a trench having a predetermined depth from at least a surface of the optical modulator to block or reduce electric interferences between pixels when the signals are transferred from the O-E conversion element to the E-O conversion element;
wherein the trench is of a plurality of trenches and the plurality of trenches is of one of a discrete trench pattern, in which the plurality of trenches are discretely disposed around pixels so that one pixel is electrically connected to adjacent pixels at four points, a cross-shaped trench pattern, in which one pixel is electrically connected to adjacent pixels at two points and four adjacent pixels are connected to each other at one connection point, and a branch-shaped trench pattern, in which one pixel is electrically connected to adjacent pixels at two points and one connection point is located at center portions of circumferences defining the pixels or at corners of the circumference.

9. The optical modulator of claim 8, wherein the trench is formed to the predetermined depth from the O-E conversion element into the optical modulator toward the E-O conversion element.

10. The optical modulator of claim 8, wherein the trench is formed to the predetermined depth from the E-O conversion element into the optical modulator toward the O-E conversion element.

11. The optical modulator of claim 8, wherein the predetermined depth is a first predetermined depth and the trench is formed to the first predetermined depth from the O-E conversion element into the optical modulator toward the E-O conversion element and formed to a second predetermined depth from the E-O conversion element into the optical modulator toward the O-E conversion element so as to be formed on both sides of the optical modulator.

12. The optical modulator of claim 8, wherein the trench completely penetrates the optical modulator from the O-E conversion element to the E-O conversion element.

13. The optical modulator of claim 8, wherein the trench comprises a tapered shape or a stepped shape so that a cross-sectional width of the trench varies according to a depth in the optical modulator.

14. The optical modulator of claim 1, further comprising a transferring element which transfers the current signals from the O-E conversion element to the E-O conversion element, and is disposed between the O-E conversion element and the E-O conversion element.

15. The optical modulator of claim 14, wherein the transferring element comprises a semiconductor substrate.

16. The optical modulator of claim 14, wherein the trench of the plurality of trenches is formed to the predetermined depth from the surface of the optical modulator into the transferring element.

17. The optical modulator of claim 14, wherein a first transparent electrode is formed on an optical image incident surface of the optical modulator, a second transparent electrode is formed on an optical image output surface of the optical modulator, and an internal electrode is formed between the O-E conversion element and the E-O conversion element.

18. The optical modulator of claim 1, further comprising a transferring element which transfers the current signals from the O-E conversion element to the E-O conversion element, and is disposed between the O-E conversion element and the E-O conversion element.

19. The optical modulator of claim 18, wherein the transferring element comprises a semiconductor substrate.

20. The optical modulator of claim 18, wherein the trench is formed to the predetermined depth from a surface of the optical modulator into the transferring element.

* * * * *